(12) United States Patent
Lopez et al.

(10) Patent No.: US 12,034,669 B2
(45) Date of Patent: Jul. 9, 2024

(54) METHOD OF TRANSMISSION OF A DATA PACKET, COMPUTER PROGRAM, AND TRANSCEIVER DEVICE

(71) Applicant: Telefonaktiebolaget LM Ericsson (publ), Stockholm (SE)

(72) Inventors: Miguel Lopez, Solna (SE); Leif Wilhelmsson, Lund (SE); Dennis Sundman, Sollentuna (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 506 days.

(21) Appl. No.: 17/422,636

(22) PCT Filed: Dec. 20, 2019

(86) PCT No.: PCT/EP2019/086783
§ 371 (c)(1),
(2) Date: Jul. 13, 2021

(87) PCT Pub. No.: WO2020/148074
PCT Pub. Date: Jul. 23, 2020

(65) Prior Publication Data
US 2022/0123901 A1     Apr. 21, 2022

Related U.S. Application Data

(60) Provisional application No. 62/792,035, filed on Jan. 14, 2019.

(51) Int. Cl.
*H04L 5/00* (2006.01)

(52) U.S. Cl.
CPC .................. *H04L 5/0053* (2013.01)

(58) Field of Classification Search
CPC ... H04L 1/0088; H04L 5/0053; H04L 1/1671; H04L 1/1812; H04L 5/0055;
(Continued)

(56) References Cited

U.S. PATENT DOCUMENTS

2020/0084801 A1* 3/2020 Yofune ................. H04L 5/0055
2020/0137612 A1* 4/2020 Li ....................... H04W 28/0221

OTHER PUBLICATIONS

International Search Report and Written Opinion dated Apr. 2, 2020 for International Application No. PCT/EP2019/086783 filed Dec. 20, 2019, consisting of 17 pages.
(Continued)

*Primary Examiner* — Anez C Ebrahim
(74) *Attorney, Agent, or Firm* — Weisberg I.P. Law. P.A.

(57) ABSTRACT

A transceiver device includes a controller arranged to identify a first set of control information within the data packet, and to re-map the data packet such that the first set of control information is mapped on bits known to be more robust. The transceiver device further includes a transmitter arranged to transmit the re-mapped data packet. The first set of control information holds information which enables for identification to combine soft bits from repeated transmissions at a receiver of the packet. The bits known to be more robust have more distinct value distribution in signal space of a used modulation and coding scheme than other bits. The transceiver device is arranged to transmit a data packet. A corresponding method, computer program, access point and station are also disclosed.

16 Claims, 5 Drawing Sheets

(58) Field of Classification Search
CPC ... H04L 1/0003; H04L 1/0026; H04L 1/0009; H04L 1/0025; H04B 17/336; H04W 74/0808
See application file for complete search history.

(56) References Cited

OTHER PUBLICATIONS

Priyanto, Basuki E., et al.; Single-Carrier Transmission for UTRA LTE Uplink; Long Term Evolution: 3GPP LTE Radio and Cellular Technology; 2009; pp. 181-212; Chapter 6; Auerbach Publishers, Inc. ProQuest Ebook Central, consisting of 32 pages.
Fowdur, T.P., et al.; Performance of IEEE 802.11n LDPC Codes with Modified Reliability Based Hybrid ARQ and Unequal Error Protection; 2015; pp. 1-6; Department of Electrical and Electronic Engineering, University of Mauritius, Reduit, Mauritius, consisting of 6 pages.
Lin, Jia-Shin, et al.; Novel Design and Analysis of Aggregated ARQ Protocols for IEEE 802.11n Networks; IEEE Transactions on Mobile Computing; Mar. 2013; pp. 556-570; vol. 12, No. 3; IEEE CS, CASS, ComSoc, IES, & SPS, consisting of 15 pages.
Chen, Kai, et al.; ARUM: Polar Coded HARQ Scheme based on Incremental Channel Polarization; May 17, 2018; consisting of 12 pages.
802.11 Working Group of the LAN/MAN Standards Committee of the IEEE Computer Society; IEEE Std 802.11-2016. Part 11: Wireless LAN Medium Access Control (MAC) and Physical Layer (PHY) Specifications; IEEE Standard for Information technology—Telecommunications and information exchange between systems, Local and metropolitan area networks—Specific requirements; Dec. 7, 2016; New York, NY, consisting of 3,534 pages.

\* cited by examiner

METHOD OF TRANSMISSION OF A DATA PACKET, COMPUTER PROGRAM, AND TRANSCEIVER DEVICE

CROSS-REFERENCE TO RELATED APPLICATIONS

This application is a Submission Under 35 U.S.C. § 371 for U.S. National Stage Patent Application of International Application No .: PCT/EP2019/086783, filed Dec. 20, 2019 entitled "METHOD OF TRANSMISSION OF A DATA PACKET, COMPUTER PROGRAM, AND TRANSCEIVER DEVICE," which claims priority to U. S. Provisional Application No .: 62/792,035, filed Jan. 14, 2019, entitled "METHOD OF TRANSMISSION OF A DATA PACKET, COMPUTER PROGRAM, AND TRANSCEIVER DEVICE," the entireties of both of which are incorporated herein by reference.

TECHNICAL FIELD

The present disclosure generally relates to a method of transmission of a data packet, a computer program for implementing the method, and a transceiver device arranged to perform the transmission. In particular, the present disclosure relates to identifying control information and re-mapping the data packet in view of this control information such that a receiver of the data packet is enabled to perform soft combining.

BACKGROUND

IEEE 802.11 data frames are formatted as illustrated in FIG. 1. They contain a header, a frame body and a Frame Check Sequence field (FCS). The MAC header contains, among other things, the address of the intended recipient(s). The frame body may contain one or more MAC Service Data Units (MSDU).

Each MSDU or Aggregated MSDU (A-MSDU) is assigned a sequence number. Moreover, MSDU's are sometimes fragmented, in which case each fragment is also assigned a number. These sequence numbers are contained in the Sequence Control field shown in FIG. 1. The Sequence Control field is formatted as shown in FIG. 2.

The IEEE 802.11 MAC data plane architecture supports frame aggregation, which enhances the throughput by allowing the transmission of two or more data frames in a single packet. Aggregation comes in two flavours. The first is MSDU aggregation (A-MSDU), and the second is MAC Protocol Data Unit (MPDU) aggregation (A-MPDU). Moreover, the two types of aggregation can be combined. An A-MSDU consists of several concatenated subframes, as shown in FIG. 3.

Each A-MSDU subframe is formatted as illustrated in FIG. 4. The Length field contains the subframe length in octets.

An A-MPDU consists of several concatenated subframes, as shown in FIG. 5.

Each A-MPDU subframe is formatted as illustrated in FIG. 6.

Unlike A-MSDU subframes, the A-MPDU subframes contain an MPDU delimiter field, formatted as shown in FIG. 7.

The MPDU delimiter field contains the MPDU length and a delimiter signature. The delimiter signature is used when scanning for an MPDU delimiter. The purpose of the MPDU delimiter is to locate the MPDUs within the A-MPDU so that the structure of the A-MPDU can be recovered when one or more MPDU delimiters are received with errors. The receiver checks the MPDU delimiter for validity based on the CRC. If the MPDU delimiter is valid, then the MPDU is extracted from the A-MPDU. The next MPDU delimiter is expected at the first multiple of 4 octets immediately after the current MPDU. This process continues until the end of the Physical Layer Protocol Data Unit (PPDU) is reached. If the MPDU delimiter is not valid, 4 octets are skipped, and it is checked whether the new location contains a valid MPDU delimiter. The process continues in this fashion until either a valid delimiter is found or the end of the PPDU is reached.

The IEEE 802.11 standard supports ARQ but it does not support HARQ. It would be beneficial to enhance the IEEE 802.11 standard to provide support for HARQ. For example, Chase combining would be rather straightforward to standardize and implement, although of course incremental redundancy could also be employed. HARQ could also be employed when any form of frame aggregation is used. However, several problems arise.

Suppose that the first transmission of a data packet is not correctly decoded at the receiver. Then the receiver should store the soft bits in order to be able to combine with a further re-transmission of the same data. But if the decoding fails, then a number of issues may arise. For example, if the address bits are corrupted, then the receiver may not know who the intended recipient of the packet is. It could have been intended for another station. Another example is when the sequence number or fragment number may be in error. Furthermore, in case of A-MPDU or A-MSDU, the length or delimiter fields could have been corrupted, so that the receiver can't determine which soft bit information corresponds to any given sub-frame.

In summary, since in the IEEE 802.11 standard the address of the recipient, the length of the frame or subframe, the sequence number and other control information necessary for HARQ is coded and modulated in the same manner as the data, the receiver can have difficulty determining which soft bits should be stored and combined.

It is therefore a desire to find a solution to at least alleviate the above discussed issues at least for some situations.

The above information disclosed in this Background section is only for enhancement of understanding of the background of the disclosure and therefore it may contain information that does not form the prior art that is already known to a person of ordinary skill in the art.

SUMMARY

The disclosure is based on the inventors' understanding that some parts of a data packet are crucial for enabling soft combining at a receiver. The inventors have thus realized that by giving these parts higher robustness at transmission by a slight re-mapping of the data packet, an improvement in transmissions can be achieved.

According to a first aspect, there is provided a method of transmission. The method comprises identifying a first set of control information within a data packet, re-mapping the data packet such that the first set of control information is mapped on bits known to be more robust, and transmitting the re-mapped data packet. The first set of control information holds information which enables for identification to combine soft bits from repeated transmissions at a receiver of the packet. The bits known to be more robust have more distinct value distribution in signal space of a used modulation and coding scheme than other bits.

The first set of control information may comprise receiver address, duration of packet, and segment and/or fragment identification. The first set of control information may further comprise length field in each aggregated medium access control service data unit, A-MDSU. Alternatively, the first set of control information may further comprise length and delimiter fields in aggregated medium access control protocol data unit, A-MPDU.

The robust bits which have more distinct value distribution in signal space of the used modulation and coding scheme may be selected bits in the same modulation and coding scheme as used by the other bits. Alternatively, the robust bits which have more distinct value distribution in signal space of the used modulation and coding scheme may have more distinct value distribution by using a more robust modulation and coding scheme than the modulation and coding scheme used for the other bits.

According to a second aspect, there is provided a transceiver device arranged to transmit a data packet. The transceiver device comprises a controller arranged to identify a first set of control information within the data packet, and to re-map the data packet such that the first set of control information is mapped on bits known to be more robust, and a transmitter arranged to transmit the re-mapped data packet. The first set of control information holds information which enables for identification to combine soft bits from repeated transmissions at a receiver of the packet. The bits known to be more robust have more distinct value distribution in signal space of a used modulation and coding scheme than other bits.

The first set of control information may comprise receiver address, duration of packet, and segment and/or fragment identification. The first set of control information may further comprise length field in each aggregated medium access control service data unit, A-MDSU. Alternatively, the first set of control information may further comprise length and delimiter fields in aggregated medium access control protocol data unit, A-MPDU.

The robust bits which have more distinct value distribution in signal space of the used modulation and coding scheme may be selected bits in the same modulation and coding scheme as used by the other bits. Alternatively, the robust bits which have more distinct value distribution in signal space of the used modulation and coding scheme may have more distinct value distribution by using a more robust modulation and coding scheme than the modulation and coding scheme used for the other bits.

According to a third aspect, there is provided an access point of a wireless local area network comprising the transceiver device of the second aspect.

According to a fourth aspect, there is provided a station of a wireless local area network comprising the transceiver device of the second aspect.

According to a fifth aspect, there is provided a computer program comprising instructions which, when executed on a processor of a communication apparatus, causes the communication apparatus to perform the method of the first aspect.

BRIEF DESCRIPTION OF THE DRAWINGS

The above, as well as additional objects, features and advantages of the present disclosure, will be better understood through the following illustrative and non-limiting detailed description of preferred embodiments of the present disclosure, with reference to the appended drawings.

DETAILED DESCRIPTION

In wireless systems it is commonplace to use forward error correction (FEC) codes in combination with automatic retransmission request (ARQ) to ensure that the data is correctly received. That is, the information that is to be transmitted is encoded so that the probability of a decoding error is decreased, and in the event that a decoding error occurs the receiver may send a negative acknowledgement (NACK) to the transmitter so that the erroneous packet can be retransmitted.

Since the received packet contains some information about the transmitted data even if the data could not be correctly recovered, it is possible to combine the information obtained in the first, erroneous, transmission with the additional data obtained in a retransmitted packet. This will further enhance the performance but comes at a cost since information from the first packet needs to be stored and later combined with the information obtained from the later received packet. Combining FEC and ARQ is commonly referred to as hybrid ARQ (HARQ). The most common flavors of HARQ are Chase combining (CC) and incremental redundancy (IR).

In the former case the non-correctly received packet is retransmitted and by combining two or more versions of the packet in the receiver an energy gain is effectively obtained leading to improved performance. In the latter case, additional parity bits are transmitted in subsequent transmissions leading to that in addition to an energy gain there will also be a coding gain. Typically, IR is based on that the original code is of relative low rate, say ¼, and that one successively as long as the codeword is not correctly decoded, adds more and more parity bits.

One of the big advantages of using HARQ instead of ARQ is that in case of an erroneous transmission, there is still some useful information transmitted from the transmitter to the receiver that can be used in the subsequent decoding. Since a decoding error in this way is less harmful, it typically allows for a more opportunistic use of the channel, i.e., packets can be sent at a slightly higher data rate on average.

When non-binary modulation is used, $\log_2(M)$ bits are mapped on each M-ary modulation symbol. This mapping can in principle be done in many ways, but typically so-called Gray mapping is used. In Gray mapping the bit-pattern for two adjacent constellation point only differ in one position. An illustration of Gray mapping for 16-QAM is provided in FIG. 8.

Figure 1:
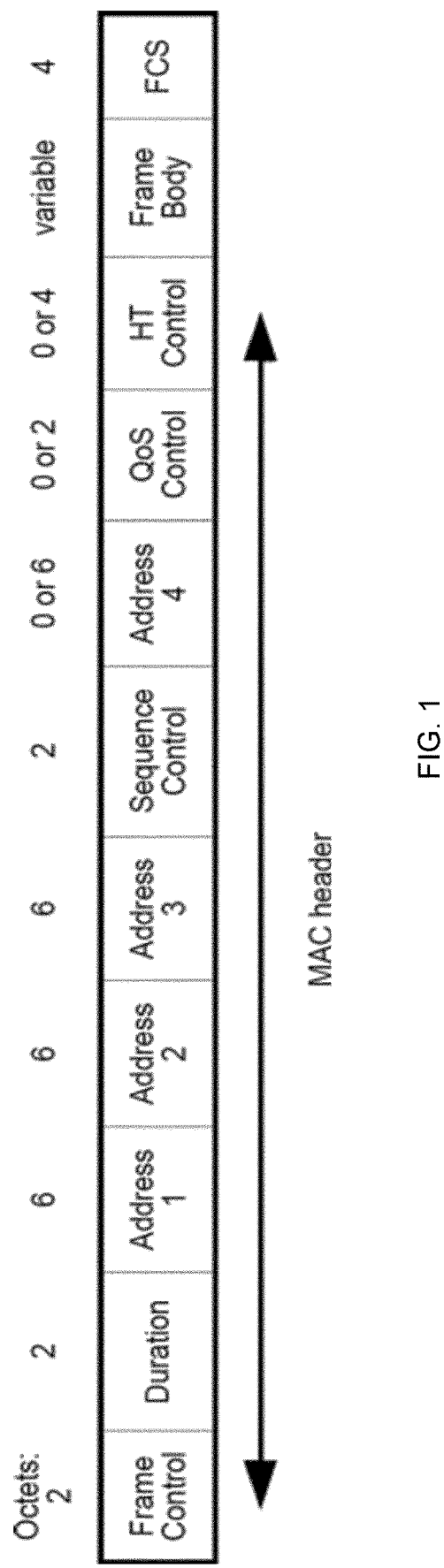
FIG. 1 is a diagram illustrating an IEEE 802.11 data frame.
Figure 2:
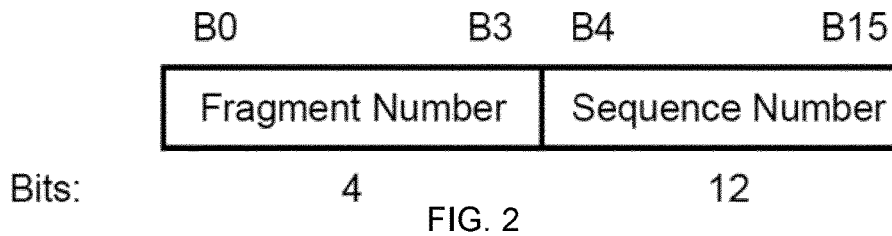
FIG. 2 is a diagram illustrating sequence control field formatting.
Figure 3:
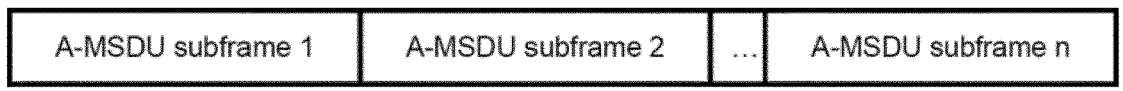
FIG. 3 is a diagram illustrating concatenated subframes for A-MSDU.
Figure 4:
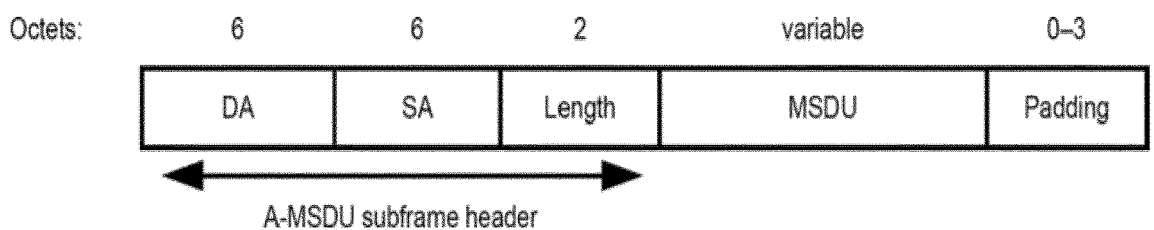
FIG. 4 is a diagram illustrating A-MSDU formatting.
Figure 5:
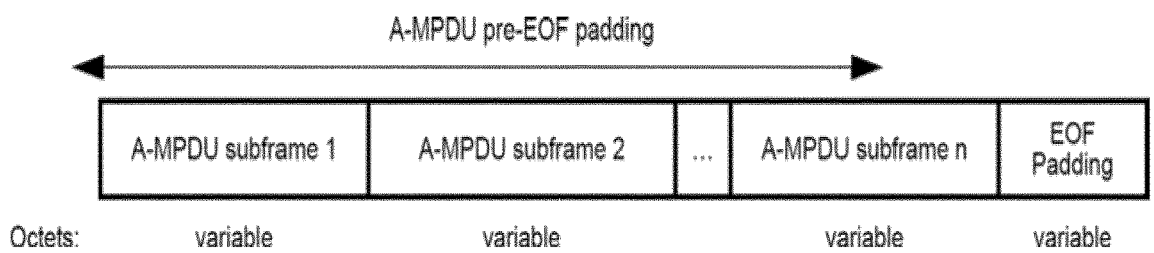
FIG. 5 is a diagram illustrating concatenated subframes for A-MPDU.
Figure 6:
FIG. 6 is a diagram illustrating A-MPDU formatting.
Figure 6:
Figure 7:
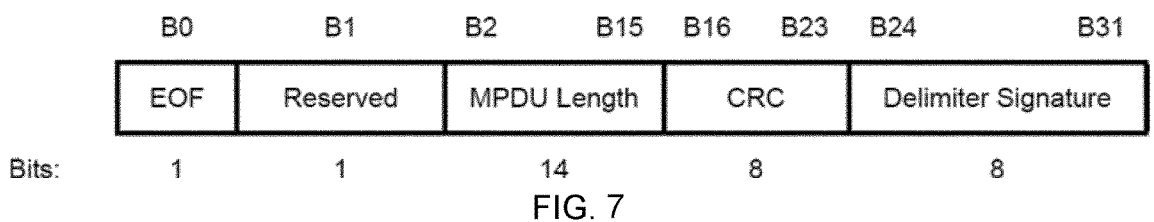
FIG. 7 is a diagram illustrating MPDU delimiter field formatting for A-MPDU subframes.
Figure 8:
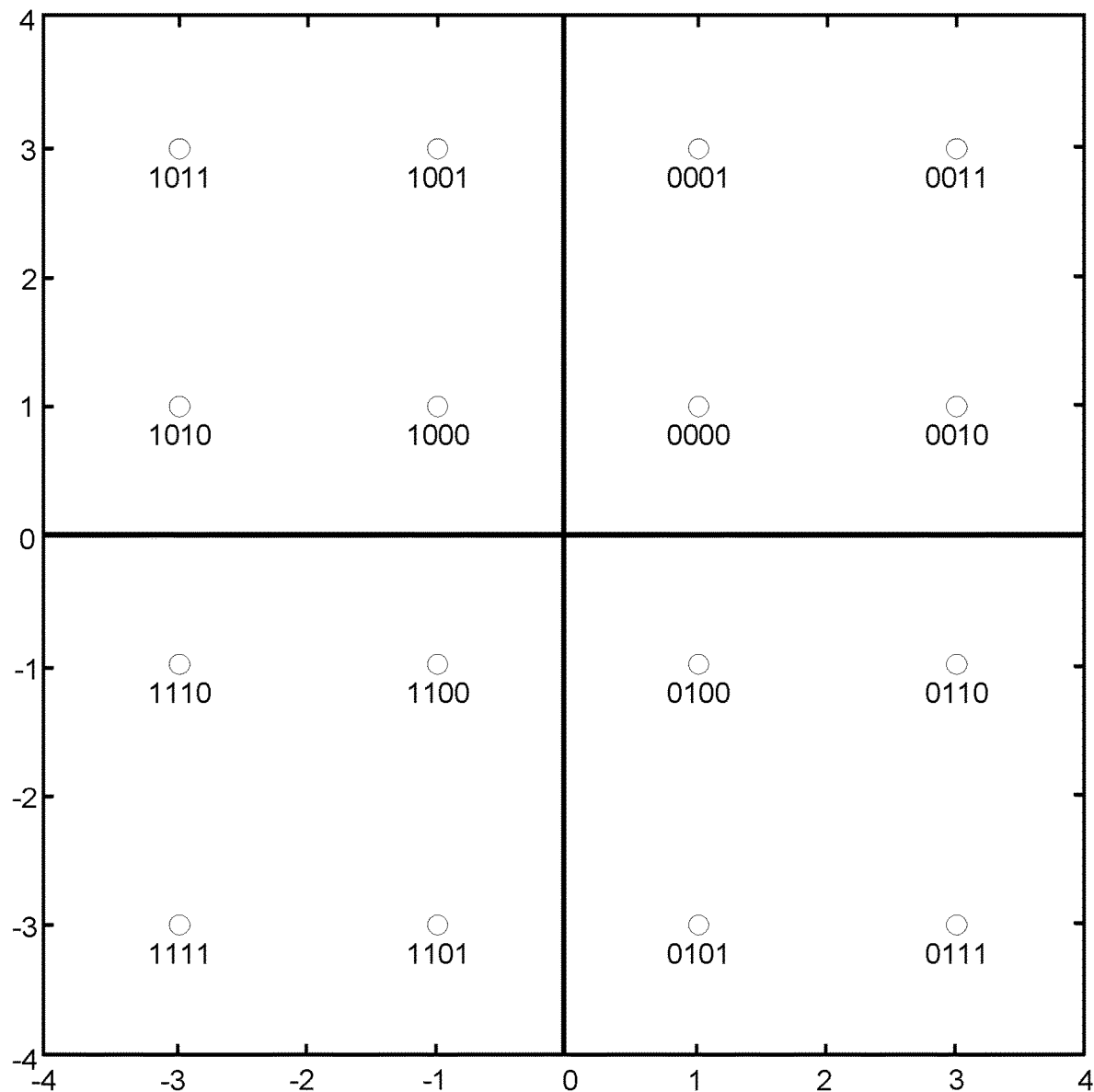
FIG. 8 illustrates an example of 16-QAM Gray mapping.

Referring to FIG. 8, it is readily seen that even if a symbol is in error not all of the different bits represented by the symbol will typically be in error. Examining the mapping a bit closer, it can be seen that the first bit determines whether the 16-QAM symbol is to the right or to the left of the imaginary axis, whereas the second bits determines whether the 16-QAM symbol is above or below the real axis. The third bit determines whether the 16-QAM symbol is in the inner two columns, i.e., the two columns closest to the imaginary axis, and the fourth bit determines whether the 16-QAM symbol is in the inner two rows, i.e., the two rows closest to the real axis. Using information theoretical arguments, it can be shown that bits 1 and 2 carry more information than bits 3 and 4.

More generally, when using Gray mapping, some of the bits will be more robust (i.e. carry more information) than others. In the current disclosure these bits are called the robust bits of the QAM constellation.

Returning to the issues discussed in the introductory section, suppose that somehow the receiver was able to store the soft values corresponding to a first transmission of a packet, and that it is expecting a retransmission. Upon reception of a packet, the receiver needs to determine whether it is addressed to it. Even if it is, the address field may be corrupt. The receiver needs to determine the sequence number/fragment number of the retransmission, but these fields may be corrupted. In case aggregation is used, the receiver needs to be able to determine the boundaries of each sub-frame, but this could fail if the relevant fields (e.g. length or delimiter) are corrupted. Approaches for dealing with this will be demonstrated below.

The purpose of the disclosure is to enable HARQ in IEEE 802.11. In order to either buffer an MSDU for soft combining or to combine the current soft bits in an MSDU with previously stored soft bits, a station receiving a packet first needs to correctly decode some control signalling, including the address of the intended receiver (in IEEE 802.11 a receiver does not know a-priori whether it is the intended receiver of a packet, it must detect and decode the packet to find out whether this is the case), the packet duration and other control signalling such as the sequence/fragment numbers. In IEEE 802.11, the same modulation and coding is used for all the bits comprised in an MSDU. The idea is to make this control signalling more robust than the rest of the packet, so that the control information is reliable enough even if the packet can't be correctly decoded.

An IEEE 802.11 data packet contains control information in the MAC header and possibly in some other fields.

A first step towards enabling HARQ in IEEE 802.11 according to the suggested approach is to identify the control information within a data packet that is necessary in order to determine which soft bits to store and combine. For the reasoning below, let's call these bits the HARQ control bits. These HARQ control bits may include:

Receiver address.
Duration.
Sequence Control field.

In case of aggregation in the form of A-MSDU is employed, the HARQ control bits may also include the Length field in each A-MSDU subframe header. In case of aggregation in the form of A-MPDU is employed, the HARQ control bits may also include e.g. the Length, CRC and Delimiter Signature fields in the MPDU delimiters.

A second step towards enabling HARQ in IEEE 802.11 in the suggested approach is to make the HARQ control information identified in the previous step more robust than the rest of the packet. In one embodiment of the disclosure this is accomplished by utilizing the fact that the LDPC codes used in IEEE 802.11 are systematic. Modulation and coding are performed as prescribed by IEEE 802.11 for any chosen Modulation and Coding Scheme (MCS), with the following modification: The systematic code bits corresponding to the HARQ control bits are re-mapped to robust bits in the selected QAM constellation, e.g. the first two bits of the constellation illustrated in FIG. 8.

Figure 9:
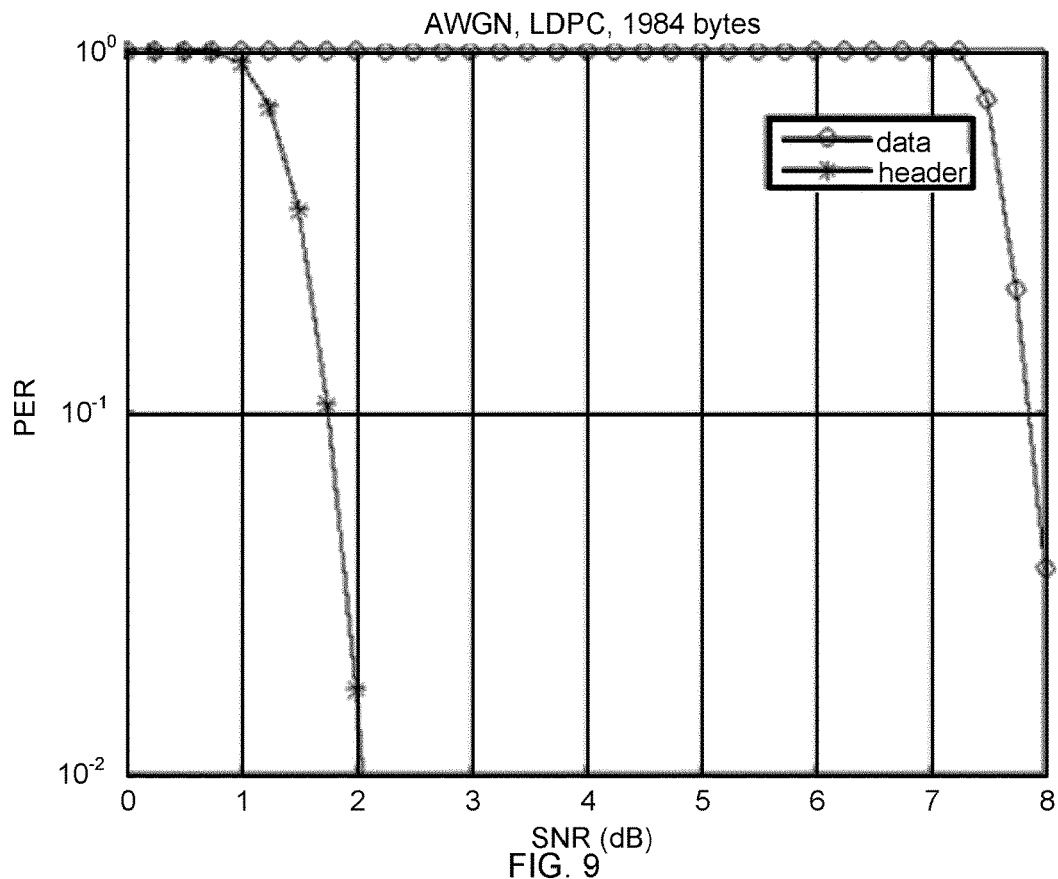
FIGS. 9 and 10 are packet error rate to signal-to-noise ratio diagrams for techniques.
Figure 10:
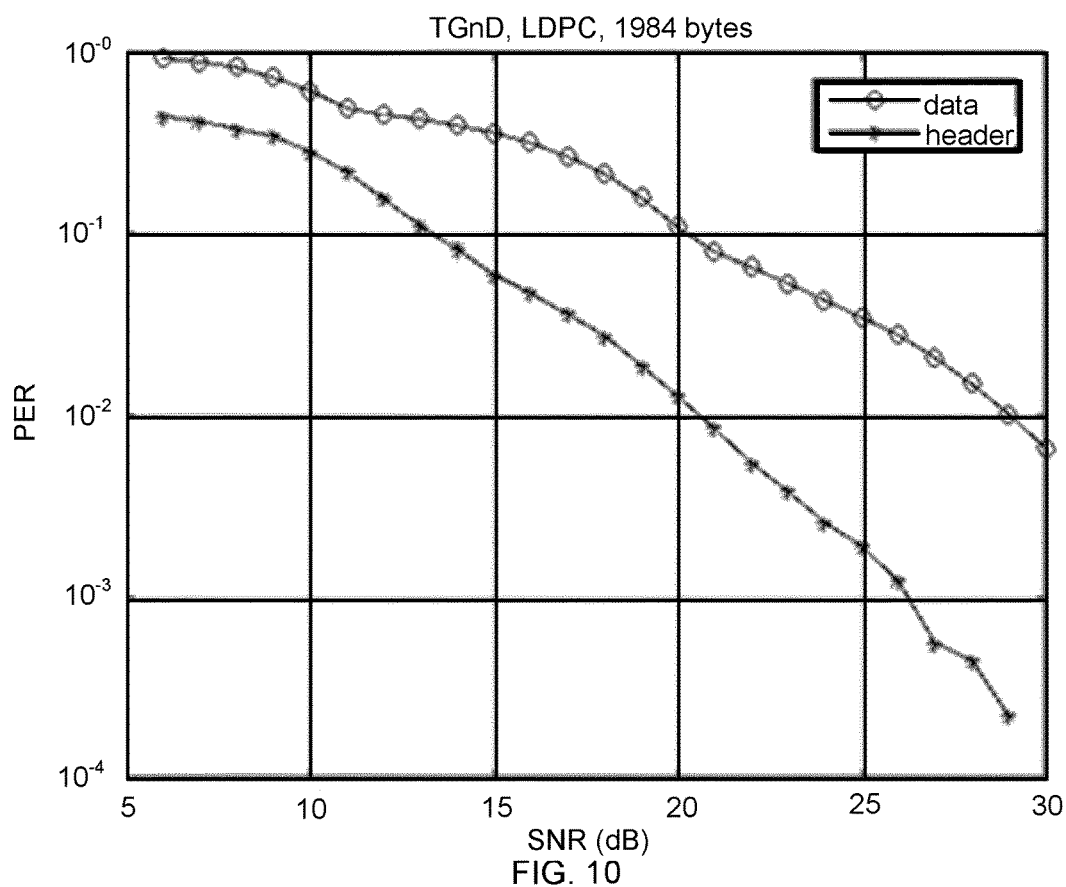

In another embodiment of the disclosure, channel coding is performed as prescribed by IEEE 802.11 according to the selected MCS, but modulation is modified as follows. The LDPC codewords carrying the HARQ control bits are identified and mapped to QAM modulation symbols having a modulation order lower than that prescribed by the selected MCS. For example, if the selected MCS employs 256-QAM, then the identified codewords are mapped to 64-QAM modulation symbols (or 16-QAM or 4-QAM or 2-QAM modulation symbols). Examples of this technique are shown in FIG. 9 and FIG. 10. In these figures the MAC header (comprising the HARQ control bits) is contained in one LDPC codeword, which is mapped to 4-QAM modulation symbols, while the rest of code bits are mapped to 16-QAM modulation symbols.

In another embodiment of the disclosure, several encoders are used. The HARQ control bits are coded using a first encoder and the data is coded by means of a second encoder. The first encoder employs a code rate lower than that of the second encoder.

It may be also necessary to signal the use of HARQ, for example by signalling HARQ in one bit in the MAC header or in one bit in the PHY header.

The embodiments above make the HARQ control bits a few dB more robust than the data, as e.g. illustrated in FIGS. 9 and 10, so that the receiving station can determine with high enough reliability which soft bits to buffer, and when a retransmission comes, it can determine with high enough reliability with which buffered MSDU(s) it ought to combine the current soft bits. These embodiments require only slight modifications to the current IEEE 802.11 physical specifications.

Figure 11:
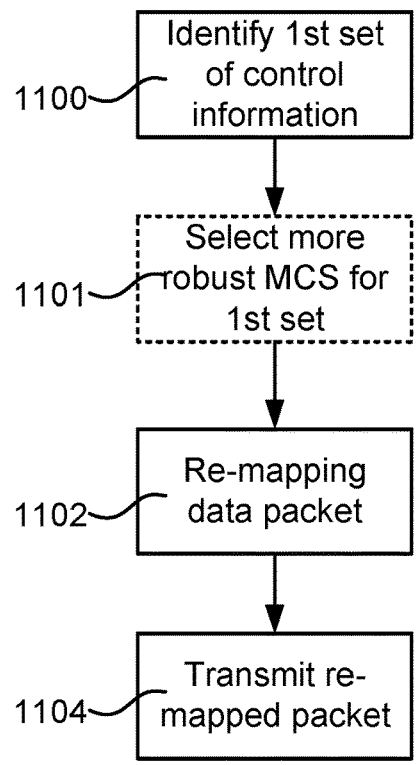
FIG. 11 is a flow chart illustrating methods according to embodiments.

FIG. 11 is a flow chart illustrating methods according to embodiments. A first set of control information is identified 1100. This first set of control information is represented by the above referenced HARQ control bits. The first set of control information is identified using the criteria discussed above, and holds information about receiver address, sequence control field, etc. which will enable the receiver to perform soft bit combining. The data packet is re-mapped 1102 to give the transmission of the first set of control information more robustness. According to one embodiment, this is achieved by selecting 1101 a more robust MCS for the first set of control information. According to another embodiment, the inherent higher robustness of some bits of a signal room representation, e.g. as illustrated with reference to FIG. 8, is utilized and the re-mapping 1102 is performed accordingly. The re-mapped packet is then transmitted 1104. Improved likelihood is thus provided that the receiver will be able to properly perform soft combining by saving appropriate soft bits and performing soft combining at repeated transmissions.

Figure 12:
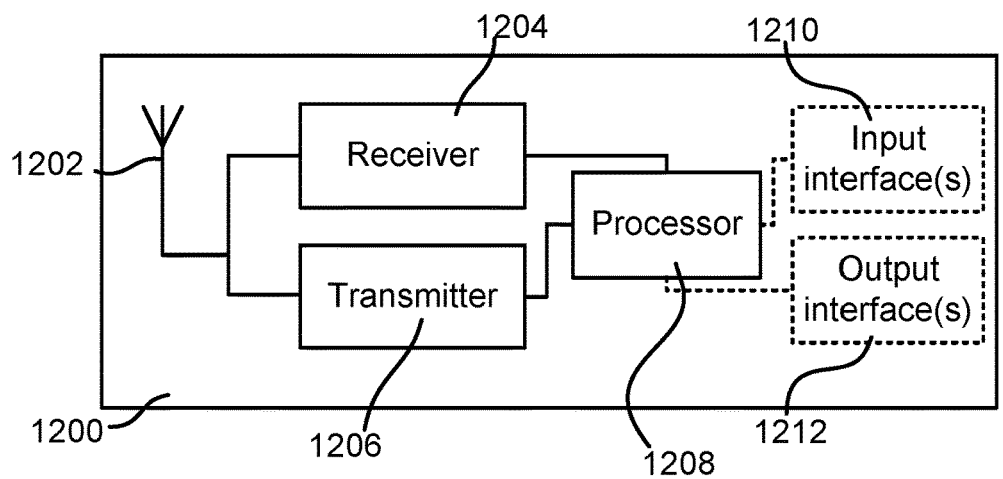
FIG. 12 is a block diagram schematically illustrating a transceiver device according to an embodiment.

FIG. 12 is a block diagram schematically illustrating a transceiver device 1200, e.g. an access point or station, according to an embodiment. The transceiver device 1200 comprises an antenna arrangement 1202, a receiver 1204 connected to the antenna arrangement 1202, a transmitter 1206 connected to the antenna arrangement 1202, a processing element 1208 which may comprise one or more circuits, one or more input interfaces 1210 and one or more output interfaces 1212. The interfaces 1210, 1212 can be user interfaces and/or signal interfaces, e.g. electrical or optical. The transceiver device 1200 is arranged to operate in a cellular communication network. In particular, by the processing element 1208 being arranged to perform the embodiments demonstrated with reference to FIG. 11, the transceiver device 1200 is capable of providing an adapted packet which enables a receiver to perform soft combining as discussed above. The processing element 1208 can also fulfill a multitude of tasks, ranging from signal processing to enable reception and transmission since it is connected to the receiver 1204 and transmitter 1206, executing applications, controlling the interfaces 1210, 1212, etc.

Figure 13:
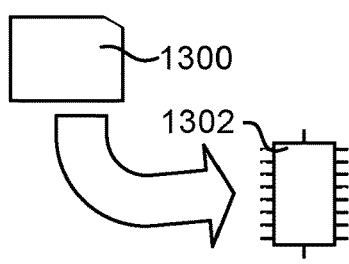
FIG. 13 schematically illustrates a computer-readable medium and a processing device.

The methods according to the present disclosure is suitable for implementation with aid of processing means, such as computers and/or processors, especially for the case where the processing element 1208 demonstrated above comprises a processor handling identification of the first set of control information and re-mapping of the packet. Therefore, there is provided computer programs, comprising instructions arranged to cause the processing means, processor, or computer to perform the steps of any of the methods according to any of the embodiments described with reference to FIG. 11. The computer programs preferably comprise program code which is stored on a computer readable medium 1300, as illustrated in FIG. 13, which can be loaded and executed by a processing means, processor, or computer 1302 to cause it to perform the methods, respectively, according to embodiments of the present disclosure, preferably as any of the embodiments described with reference to FIG. 11. The computer 1302 and computer program product 1300 can be arranged to execute the program code sequentially where actions of the any of the methods are performed stepwise. The processing means, processor, or computer 1302 is preferably what normally is referred to as an embedded system. Thus, the depicted computer readable medium 1300 and computer 1302 in FIG. 13 should be construed to be for illustrative purposes only to provide understanding of the principle, and not to be construed as any direct illustration of the elements.

The disclosure enables HARQ in IEEE 802.11 while remaining to a large extent backwards compatible. The proposed enhancements to IEEE 802.11 are minor and should be relatively easy to implement in existing IEEE 802.11 chipsets by means of firmware or software updates. This disclosure may be summarized by the following items:

1. A method of transmission, the method comprising
   identifying a first set of control information within a data packet;
   re-mapping the data packet such that the first set of control information is mapped on bits known to be more robust; and
   transmitting the re-mapped data packet, wherein
   the first set of control information holds information which enables for identification to combine soft bits from repeated transmissions at a receiver of the packet; and
   the bits known to be more robust have more distinct value distribution in signal space of a used modulation and coding scheme than other bits.

2. The method of item 1, wherein the first set of control information comprises receiver address, duration of packet, and segment and/or fragment identification.

3. The method of item 2, wherein the first set of control information further comprises length field in each aggregated medium access control service data unit, A-MDSU.

4. The method of item 2, wherein the first set of control information further comprises length and delimiter fields in aggregated medium access control protocol data unit, A-MPDU.

5. The method of any one of items 1 to 4, wherein the robust bits which have more distinct value distribution in signal space of the used modulation and coding scheme are selected bits in the same modulation and coding scheme as used by the other bits.

6. The method of any one of items 1 to 4, wherein the robust bits which have more distinct value distribution in signal space of the used modulation and coding scheme have more distinct value distribution by using a more robust modulation and coding scheme than the modulation and coding scheme used for the other bits.

7. A transceiver device arranged to transmit a data packet, the transceiver device comprising
   a controller arranged to identify a first set of control information within the data packet, and to re-map the data packet such that the first set of control information is mapped on bits known to be more robust; and
   a transmitter arranged to transmit the re-mapped data packet, wherein
   the first set of control information holds information which enables for identification to combine soft bits from repeated transmissions at a receiver of the packet; and
   the bits known to be more robust have more distinct value distribution in signal space of a used modulation and coding scheme than other bits.

8. The transceiver device of item 7, wherein the first set of control information comprises receiver address, duration of packet, and segment and/or fragment identification.

9. The transceiver device of item 8, wherein the first set of control information further comprises length field in each aggregated medium access control service data unit, A-MDSU.

10. The transceiver device of item 8, wherein the first set of control information further comprises length and delimiter fields in aggregated medium access control protocol data unit, A-MPDU.

11. The transceiver device of any one of items 7 to 10, wherein the robust bits which have more distinct value distribution in signal space of the used modulation and coding scheme are selected bits in the same modulation and coding scheme as used by the other bits.

12. The transceiver device of any one of items 7 to 10, wherein the robust bits which have more distinct value distribution in signal space of the used modulation and coding scheme have more distinct value distribution by using a more robust modulation and coding scheme than the modulation and coding scheme used for the other bits.

13. An access point of a wireless local area network comprising the transceiver device of any one of items 7 to 12.

14. A station of a wireless local area network comprising the transceiver device of any one of items 7 to 12.

15. A computer program comprising instructions which, when executed on a processor of a communication apparatus, causes the communication apparatus to perform the method according to any of items 1 to 6.

The invention claimed is:

1. A method of transmission, the method comprising:
identifying a first set of control information within a data packet, the first set of control information holding information which enables for identification to combine soft bits from repeated transmissions at a receiver of the packet;
re-mapping the data packet such that the first set of control information is mapped on bits known to be more robust, the bits known to be more robust having a more distinct value distribution in signal space by using a more robust modulation and coding scheme than a modulation and coding scheme used for other bits; and
transmitting the re-mapped data packet.

2. The method of claim 1, wherein the first set of control information comprises receiver address, duration of packet, and at least one of segment and fragment identification.

3. The method of claim 2, wherein the first set of control information further comprises length field in each aggregated medium access control service data unit, A-MDSU.

4. The method of claim 3, wherein the robust bits which have more distinct value distribution in signal space of the used modulation and coding scheme are selected bits in the same modulation and coding scheme as used by the other bits.

5. The method of claim 2, wherein the first set of control information further comprises length and delimiter fields in aggregated medium access control protocol data unit, A-MPDU.

6. The method of claim 5, wherein the robust bits which have more distinct value distribution in signal space of the used modulation and coding scheme are selected bits in the same modulation and coding scheme as used by the other bits.

7. The method of claim 2, wherein the robust bits which have more distinct value distribution in signal space of the used modulation and coding scheme are selected bits in the same modulation and coding scheme as used by the other bits.

8. The method of claim 1, wherein the robust bits which have more distinct value distribution in signal space of the used modulation and coding scheme are selected bits in the same modulation and coding scheme as used by the other bits.

9. A transceiver device arranged to transmit a data packet, the transceiver device comprising:
a controller configured to identify a first set of control information within the data packet, and to re-map the data packet such that the first set of control information is mapped on bits known to be more robust, the first set of control information holding information which enables for identification to combine soft bits from repeated transmissions at a receiver of the packet, and the bits known to be more robust having more distinct value distribution in signal space by using a more robust modulation and coding scheme than a modulation and coding scheme used for other bits; and
a transmitter configured to transmit the re-mapped data packet.

10. The transceiver device of claim 9, wherein the first set of control information comprises receiver address, duration of packet, and at least one of segment and fragment identification.

11. The transceiver device of claim 10, wherein the first set of control information further comprises length field in each aggregated medium access control service data unit, A-MDSU.

12. The transceiver device of claim 10, wherein the first set of control information further comprises length and delimiter fields in aggregated medium access control protocol data unit, A-MPDU.

13. The transceiver device of claim 9, wherein the robust bits which have more distinct value distribution in signal space of the used modulation and coding scheme are selected bits in the same modulation and coding scheme as used by the other bits.

14. The transceiver device of claim 9, wherein the transceiver device is comprised in an access point of a wireless local area network.

15. The transceiver device of claim 9, wherein the transceiver device is comprised in a station of a wireless local area network.

16. A non-transitory computer storage medium storing an executable computer program comprising instructions which, when executed on a processor of a communication apparatus, causes the communication apparatus to perform a method, the method comprising:
identifying a first set of control information within a data packet, the first set of control information holding information which enables for identification to combine soft bits from repeated transmissions at a receiver of the packet;
re-mapping the data packet such that the first set of control information is mapped on bits known to be more robust, the bits known to be more robust having more distinct value distribution in signal space by using a more robust modulation and coding scheme than a modulation and coding scheme used for other bits; and
transmitting the re-mapped data packet.

* * * * *